United States Patent
Chen et al.

(10) Patent No.: US 9,627,228 B1
(45) Date of Patent: Apr. 18, 2017

(54) METHOD FOR MANUFACTURING A CHIP PACKAGE HAVING A COATING LAYER

(71) Applicant: Powertech Technology Inc., Hsinchu County (TW)

(72) Inventors: Shih-Chun Chen, Hsinchu County (TW); Sheng-I Huang, Hsinchu County (TW); Ying-Lin Chen, Hsinchu County (TW); Ta-Hao Chang, Hsinchu County (TW); I-Fong Wu, Hsinchu County (TW); Chi-Chung Yu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/226,930

(22) Filed: Aug. 3, 2016

(30) Foreign Application Priority Data

May 5, 2016 (TW) .............................. 105114027 A

(51) Int. Cl.
| | |
|---|---|
| *H01L 21/56* | (2006.01) |
| *H01L 23/552* | (2006.01) |
| *H01L 23/00* | (2006.01) |
| *H01L 21/48* | (2006.01) |
| *H01L 21/78* | (2006.01) |

(52) U.S. Cl.
CPC ........ *H01L 21/561* (2013.01); *H01L 21/4871* (2013.01); *H01L 21/78* (2013.01); *H01L 23/552* (2013.01); *H01L 24/14* (2013.01)

(58) Field of Classification Search
CPC ... H01L 21/561; H01L 21/4871; H01L 21/78; H01L 23/552; H01L 24/14
See application file for complete search history.

(56) References Cited

U.S. PATENT DOCUMENTS

| | | | |
|---|---|---|---|
| 6,338,980 B1* | 1/2002 | Satoh | H01L 21/561 257/E21.508 |
| 7,645,633 B2 | 1/2010 | Barnes et al. | |
| 9,515,048 B2* | 12/2016 | Wu | H01L 24/97 |
| 2005/0090043 A1* | 4/2005 | Tsai | H01L 21/4853 438/108 |
| 2014/0057394 A1* | 2/2014 | Ramasamy | H01L 25/50 438/113 |

* cited by examiner

*Primary Examiner* — Errol Fernandes
(74) *Attorney, Agent, or Firm* — Jianq Chyun IP Office

(57) ABSTRACT

A method for manufacturing a chip package structure having a coating layer is provided. At least one chip package structure is mounted onto a terminal-protection film. The chip package structure has a top side, a back side opposite to the top side and a plurality of lateral sides. A plurality of terminals is disposed on the back side. The terminal-protection film at least partially seals the back side. A coating layer is formed over the top side, the lateral sides and a periphery region of the chip package structure, wherein the coating layer is not formed on the back side and the terminals. The terminal-protection film is debonded from the chip package structure.

20 Claims, 12 Drawing Sheets

METHOD FOR MANUFACTURING A CHIP PACKAGE HAVING A COATING LAYER

CROSS-REFERENCE TO RELATED APPLICATION

This application claims the priority benefit of Taiwan application serial no. 105114027, filed on May 5, 2016. The entirety of the above-mentioned patent application is hereby incorporated by reference herein and made a part of this specification.

BACKGROUND OF THE INVENTION

Field of Invention

The present invention relates to a field of semiconductor chip package, and more particularly, to a manufacturing method of chip package structure having a coating layer.

Description of Related Art

The chip package structure can be classified into two categories such as a solderless terminal type and a solder terminal type, in which the solderless terminal type belongs to a land grid array (LGA) packaging technology, and the solder terminal belongs to a ball grid array (BGA) packaging technology. It is known that electromagnetic interference (EMI) shielding technology or high-temperature coating technology are widely used in the chip package structure of the solderless terminal type. The electromagnetic interference (EMI) shielding layer is often formed by physical vapor deposition (PVD) process, such as sputtering. For example, the forming process of the electromagnetic interference (EMI) shielding layer is performed under a high-vacuum environment, and the process temperature approximately approaches 300 degrees Celsius. However, the EMI technology or the high-temperature coating technology cannot be adopted in a forming process of a chip package structure of the solder terminal type. To be specific, when a high-temperature coating process is performed on the chip package structure of the solder terminal type, the process temperature may be greater than a melting point of soldering terminals (e.g., the melting point of tin solder balls is about 217 degrees Celsius). Consequently, a high-temperature coating layer cannot be successfully formed on a top surface and side surfaces of the chip package structure of the solder terminal type.

Furthermore, in the conventional manufacturing processes of the chip package structure, an encapsulant covers a plurality of elements in large areas, and then the elements are diced or singulated to separate from one another. As known, the high-temperature coating process is usually performed before the dicing or singulation step. Meaning, the coating layer is exclusively formed on the top surface of the chip package structure, which indicates that there is no expected protection for the side surfaces of the chip package structure. It should be noted that if the high-temperature coating process is simply performed after the dicing or singulation step, there is a problem of a greatly increase in the manufacturing cost. Also, a deterioration of product yield may arise since the encapsulant further contaminates a back surface of the chip package structure and soldering terminals located on the back surface.

SUMMARY OF THE INVENTION

The invention provides a manufacturing method of a chip package structure having a coating layer. The coating layer is formed on a top side and lateral sides of the chip package structure for protecting terminals (e.g., tin solder balls, bumps) of the chip package structure from effects of a high temperature process. With such terminal-protection film, heat-dissipating efficiency of the chip package structure is enhanced in order to reduce temperature of terminals. Additionally, the coating layer is effectively isolated from the terminals to avoid improper connections.

The invention provides a manufacturing method of a chip package structure having a coating layer, which includes the following steps. A terminal-protection film is provided. At least one chip package structure is disposed onto the terminal-protection film. The chip package structure has a top side, a back side opposite to the top side, and a plurality of lateral sides. A plurality of terminals is disposed on the back side. The terminal-protection film at least partially seals the back side. A coating layer is formed over the top side, the lateral sides, and a periphery region of the chip package structure. Due to the protection provided by the terminal-protection film, the coating layer is not formed on the back side and the terminals. The terminal-protection film is debonded from the chip package structure, such that the coating layer is divided into a first portion and a second portion. The first portion of the coating layer covers the top side and the lateral sides of the chip package structure, and the second portion of the coating layer is a remaining portion of the coating layer. The terminals remain completely intact on the back side of the chip package structure after the debonding of the terminal-protection film.

In an embodiment of the invention, a heat dissipation is performed by the terminal-protection film during forming the coating layer by cooling down of the coating layer upon contact with the terminal-protection film.

In an embodiment of the invention, the coating layer is an electromagnetic interference shielding layer formed through sputtering.

In an embodiment of the invention, in the step of providing the terminal-protection film, the terminal-protection film in liquid phase is coated on a carrier; and after the mounting step of the chip package structure, but before the step of forming the coating layer, the terminal-protection film is cured to form a film.

In an embodiment of the invention, in the mounting step of the chip package structure, the terminal-protection film seals the terminals within the terminal-protection film and covers at least a portion of the back side of the chip package structure.

In an embodiment of the invention, in the mounting step of the chip package structure, the chip package structure includes a singulated package to be mounted.

In an embodiment of the invention, in the mounting step of the chip package structure, the chip package structure is a part of a chip package array mounted on the terminal-protection film, and the mounting step of the chip package structure further includes performing a singulation step on the chip package array to form a plurality of singulated chip package structures and the lateral sides thereof.

In an embodiment of the invention, in the step of providing the terminal-protection film, the terminal-protection film in liquid phase is coated over a through hole or a cavity of a carrier; and after the mounting step of the chip package structure, but before the step of forming the coating layer, the terminal-protection film is cured to form a film.

In an embodiment of the invention, in the step of forming the coating layer, a temperature of the terminal-protection film is lower than a forming temperature of the coating layer and a melting point of the terminals, and heat energy generated from the chip package structure is transmitted to the carrier through the terminal-protection film.

In an embodiment of the invention, in the step of providing the terminal-protection film, the terminal-protection film is cured to form a film and has at least one terminal receiving hole; in the mounting step of the chip package structure, the terminals are sealed inside the at least one terminal receiving hole; and in the step of forming the coating layer, a heat dissipation is performed by the terminal-protection film, such that a temperature of the terminal-protection film is maintained to be lower than a forming temperature of the coating layer and a melting point of the terminals, and a heat energy generated from the chip package structure is transmitted to the external through the terminal-protection film.

Based on the above, the manufacturing method of the invention is capable of burying the terminals (such as tin solder balls) of a BGA type chip package structure into the terminal-protection film. The terminal-protection film has properties of viscidity, plasticity, heat resistance, and thermal conductivity. Also, the manufacturing method of the invention is capable of using a film to form a carrier having a specific shape. The terminal-protection film and the chip package structure together are loaded onto the carrier to perform a coating process. The coating layer formed by coating process may be a metal coating layer having an electromagnetic interference shielding (EMI) function, or a high-temperature coating layer. Due to a protection provided by the terminal-protection film, the manufacturing method of the invention is capable of preventing the back side of the chip package structure being affected by the coating process, wherein the back side is disposed with the terminals. The manufacturing method of the invention further includes performing heat dissipation for the chip package structure, which prevents the terminals such as tin solder ball from melting due to over-heat.

To make the above features and advantages of the present invention more comprehensible, several embodiments accompanied with drawings are described in detail as follows.

DESCRIPTION OF EMBODIMENTS

The accompanying drawings are included to provide further understanding, and are incorporated in and constitute a part of this specification. The accompanying drawings illustrate exemplary embodiments in a simplified schematic views and, together with the description, serve to explain the principles of the disclosure, the disclosure is not limited thereto. Specifically, the accompanying drawings demonstrate relationships among elements and have no limitation to the elements with respect to numbers, shapes, size, and so on. The drawings of the elements are not to scale, and dimensions of the elements are arbitrarily expanded or reduced for clarity. In practical applications, the number, shape and size of the elements are determined by an actual design in demand, and a detailed layout of the actual elements may be more complex.

FIG. 1A to FIG. 1E are schematic cross-sectional views illustrating a manufacturing method of a chip package structure having a coating layer according to a first embodiment of the invention. The manufacturing method includes the following steps.

Figure 1A:
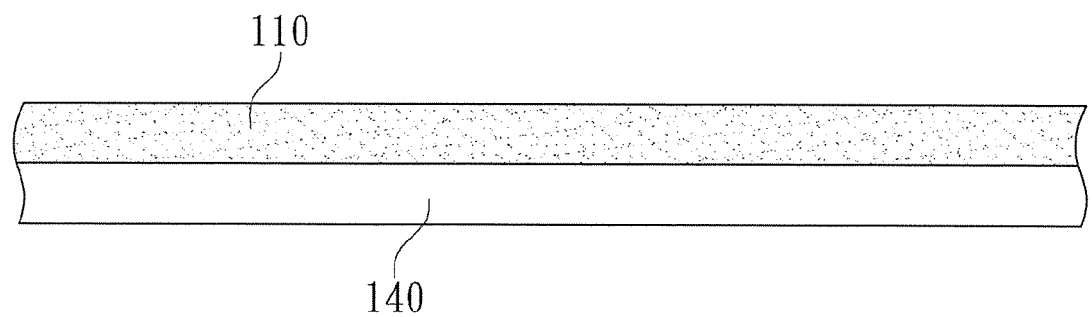
FIG. 1A to FIG. 1E are schematic cross-sectional views illustrating a manufacturing method of a chip package structure having a coating layer according to a first embodiment of the invention.
Figure 2:
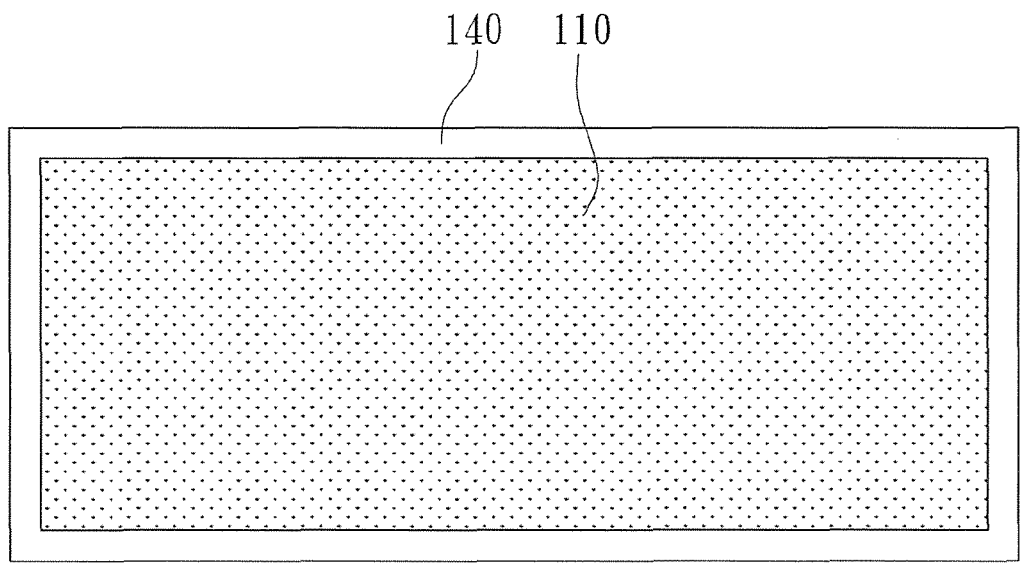
FIG. 2 is a schematic top view illustrating a terminal-protection film and a carrier of the manufacturing method of the first embodiment of the invention.

Referring to FIG. 1A, a film forming step is performed to provide a terminal-protection film 110. In the step of providing the terminal-protection film 110, the terminal-protection film 100 in liquid phase is coated on a carrier 140. The carrier may be a metal plate to facilitate heat dissipation. Referring to FIG. 2, a frame of the carrier 140 is used to avoid an overflow caused by the coating step of the terminal-protection film 110. The terminal-protection film 110 is curable and has thermal conductivity. The terminal-protection film 110 may be cured by cooling down to room temperature or by heating. Specifically, before curing, the terminal-protection film 110 is in a thick liquid state, which has a hardness range of 0 A-15 A to facilitate burying the terminals. After curing, the terminal-protection film 110 behaves as an elastic film, which has a hardness range of 15 A-30 A to allow debonding of the terminal-protection film 110 without damaging the terminals. After curing, the terminal-protection film 110 is able to handle the temperature (e.g., above 250 degrees Celsius) of a high-temperature coating process while maintaining its viscidity. The curing step of the terminal-protection film 110 is performed after the terminal-protection film 110 is provided. In one embodiment, the terminal-protection film 110 can be a one-component adhesive or a multi-component adhesive. Using either the one-component adhesive or the multi-component adhesive, the terminal-protection film 110 is in liquid phase (e.g., watery) to be gradually cured by cooling down to room temperature or by heating. During the curing step, the terminal-protection film 110 undergoes elastic thick liquid state and has a hardness of 0 A-100 A. Under such state, the terminals, such as tin solder balls, are allowed to be buried into the terminal-protection film 110. Then, the terminal-protection film 110 is cured by heating until a hardness of about 15 A-30 A is reached. In one embodiment, the terminal-protection film 110 may be pre-formed to be an elastic sheet film having a hardness of 0 A-100 A, in which the terminal-protection film 110 is not hardened after being exposed to air. Instead, the terminal-protection film 110 is hardened by heating. When the terminals, such as tin solder balls, are encapsulated by the terminal-protection film 110, a high-temperature coating process may be performed. Afterward, the terminal-protection film 110 is removed.

Figure 1B:
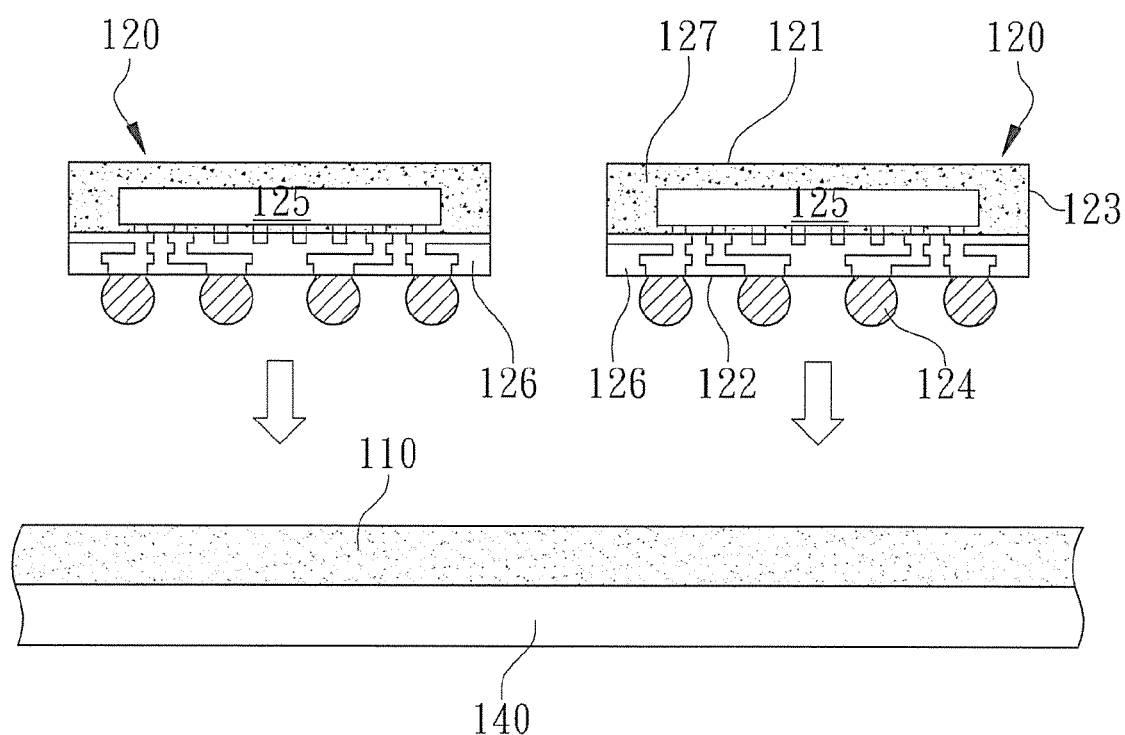
Figure 1C:
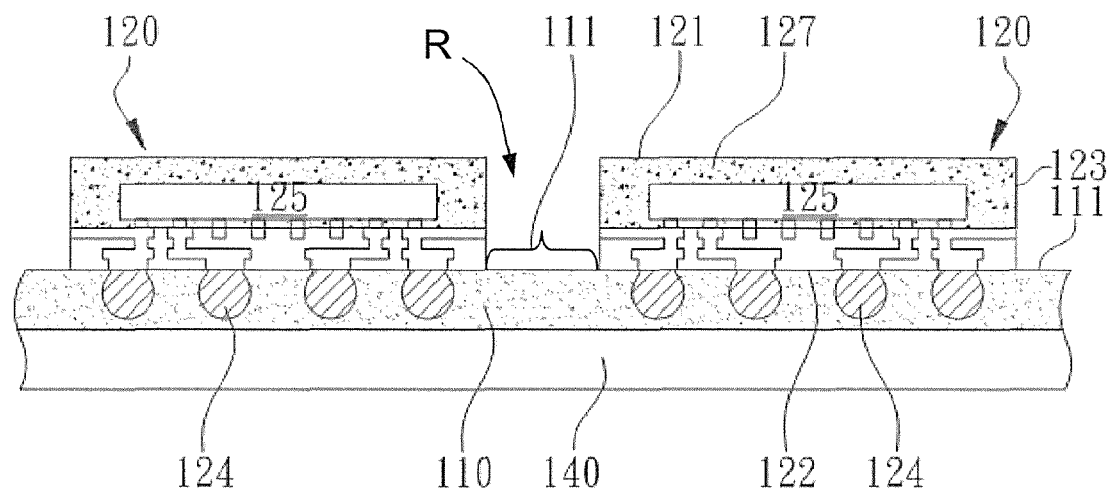

Referring to FIG. 1B and FIG. 1C, a mounting step of a package structure is performed to mount the chip package structure 120 onto the terminal-protection film 110. The chip package structure 120 has a top side 121, a back side 122 opposite to the top side 121, and a plurality of lateral sides 123. A plurality of terminals 124 such as tin solder balls or bumps is disposed on the back side 122. The terminal-protection film 110 at least partially seals the back side 122. In the embodiment, in the mounting step of the chip package structure 120, the terminal-protection film 110 encapsulates the terminals 124 and covers the back side 122 of the chip package structure 120. As shown in FIG. 1C, the terminals 124 are buried into the terminal-protection film 110. A thickness of the terminal-protection film 110 being coated in liquid phase is greater than or equal to a height of the terminals 124 protruded from the back side 122. In some embodiments, the thickness of the terminal-protection film 110 may be 1-2 times the height of the terminals 124. During the mounting step of the chip package structure 120, the chip package structure 120 is a singulated package to be mounted. As shown in FIG. 1B, each chip package structure 120 is mounted onto the terminal-protection film 110. After the mounting step of the chip package structure 120, but before the high-temperature coating process, the terminal-protection film 110 is cured to form a film. In one embodiment, the chip package structure 110 may, for example, be a ball grid array (BGA) type. The chip package structure 110 may include a chip 125, a substrate 126 for carrying the chip 125, and an encapsulant 127 to encapsulate the chip 125. The chip 125 is electrically connected to the terminals 124 by having the chip 125 coupled to the substrate 126 through a flip chip bond. The encapsulant 127 contributes at least 60% of a surface area of the lateral sides 123. When the chip package structure 120 is a wafer-level package type or a panel-level package type, the substrate 126 may be omitted, and a redistribution layer (RDL) may be adopted to replace a circuit structure of the substrate 126.

Figure 1D:
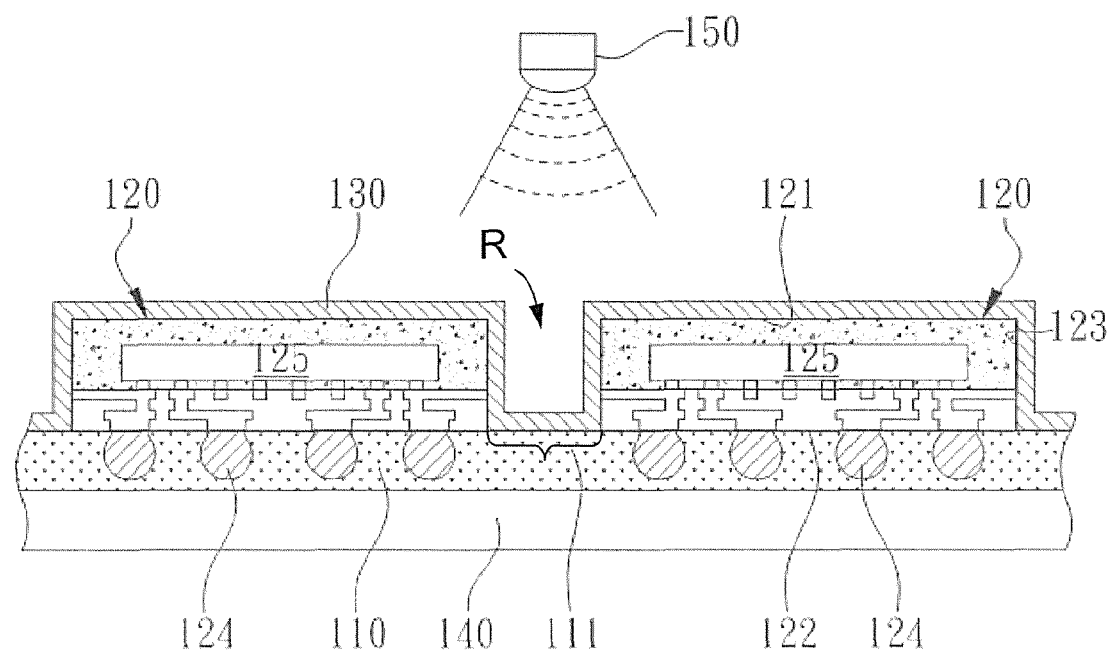

Referring to FIG. 1D, a high-temperature coating step is performed to form a coating layer 130. The coating layer 130 is disposed over the top side 121, the lateral sides 123, and an exposed surface 111 of the terminal-protection film. The exposed surface 111 of the terminal-protection film 110 surrounds a periphery region of the chip package structure 120. Due to the protection provided by the terminal-protection film 110, the coating layer 130 may not be formed on the back side 122 and the terminals 124. In the embodiment, the exposed surface 111 is a portion of a top surface of the terminal-protection film 110 facing to the chip package structure 120, wherein the exposed surface 111 is the part of the terminal-protection film 110 exposed by the chip package structure 120 as shown in FIG. 1D.

A coating device 150, such as a sputtering machine, may be used to form the coating layer 130. In the embodiment, the exposed surface 111 is the top surface of the terminal-protection film 110 not covered by the chip package structure 120. In other words, the exposed surface 111 includes at least one exposed region of the terminal-protection film 110 between the lateral sides 123 of two adjacent chip package structure 120; e.g., a bottom side of a U-shaped recess R (as shown in FIG. 1C).

A forming temperature of the coating layer 130 may be greater than a melting point of the terminals 124. The terminals 124 may include a plurality of the tin solder balls. The coating layer 130 may be an electromagnetic interference shielding layer formed through sputtering. The terminal-protection film 110 may have thermal conductivity. Therefore, during the forming step of the coating layer 130, a heat dissipation is simultaneously performed by the terminal-protection film 110. Accordingly, a temperature of the carrier 140 is maintained to be lower than the forming temperature of the coating layer 130 and the melting point of the terminals 124. As such, the heat energy generated from the chip package structure 120 is transmitted to the external through the terminal-protection film 110. Further, since the coating layer 130 is in contact with the terminal-protection film 110, the coating layer 130 is able to be cooled down.

Figure 1E:
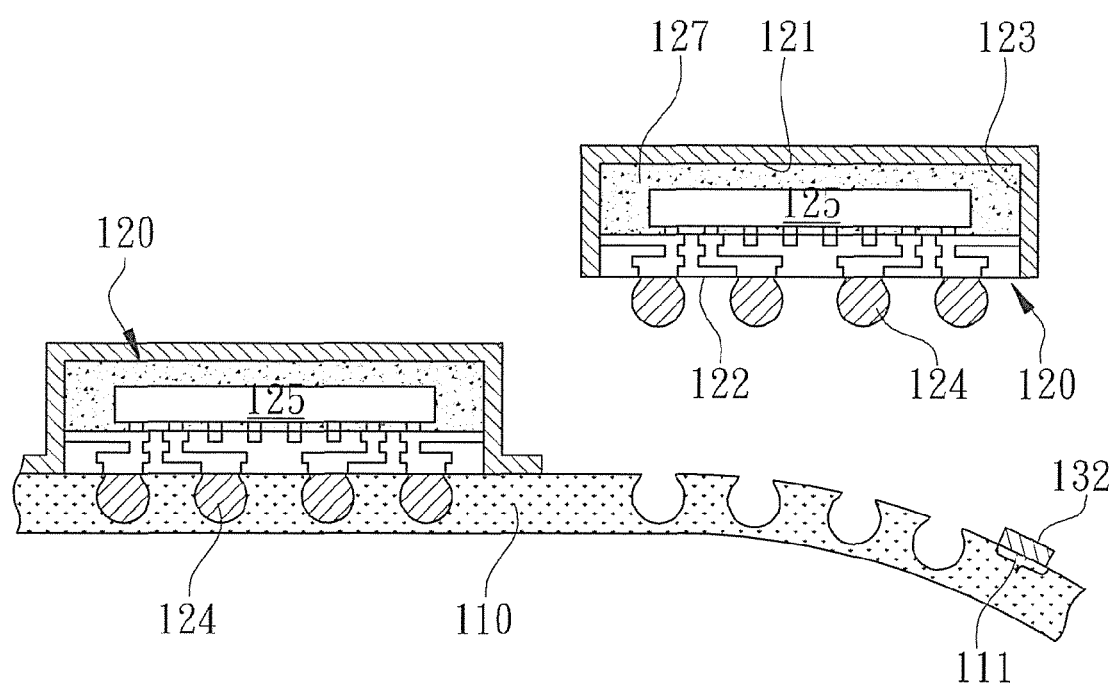

Referring to FIG. 1E, a film debonding step is performed to debond the terminal-protection film 110 from the chip package structure 120. The coating layer 130 is divided into a first portion 131 and a second portion 132. The first portion 131 of the coating layer 130 covers the top side 121 and the lateral sides 123 of the chip package structure 120. The second portion 132 of the coating layer 130 is formed over the exposed surface 111. The terminals 124 remain completely intact on the back side 122 of the chip package structure 120. The terminal-protection film 110 is maintained to be a whole film after debonding from the chip package structure 120. The terminal-protection film 110 may be completely removed from the surfaces of the terminals 124.

In the embodiment, the manufacturing method of the chip package structure having the coating layer provides the coating layer 130 formed on the top side 121 and the lateral sides 123 of the chip package structure 120. Due to the presence of the coating layer 130, the terminals 124 of the chip package structure 120 are protected from the effects of a high temperature process. Further, the coating layer 130 and the terminals 124 are isolated to avoid improper connections therebetween.

Other embodiments are provided below for further illustration. It should be noted herein that the reference numerals and part of the contents in the previous embodiment are used in the following embodiments. The identical reference numerals indicate identical or similar components, and repeated description of the same technical contents is omitted. For detailed description of the omitted parts, reference can be found in the previous embodiment, and no description will be repeated in the following embodiments for brevity.

FIG. 3A to FIG. 3E are schematic cross-sectional views illustrating a manufacturing method of a chip package structure having a coating layer according to a second embodiment of the invention. The manufacturing method includes the following steps.

Figure 3A:
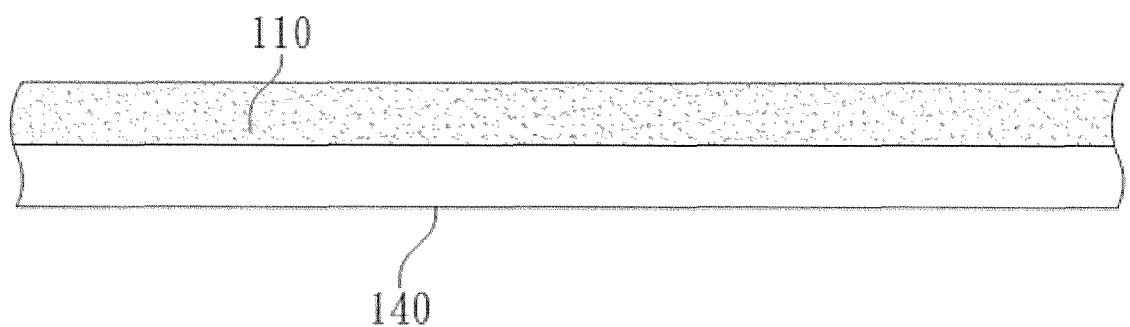
FIG. 3A to FIG. 3E are schematic cross-sectional views illustrating a manufacturing method of a chip package structure having a coating layer according to a second embodiment of the invention.
Figure 3B:
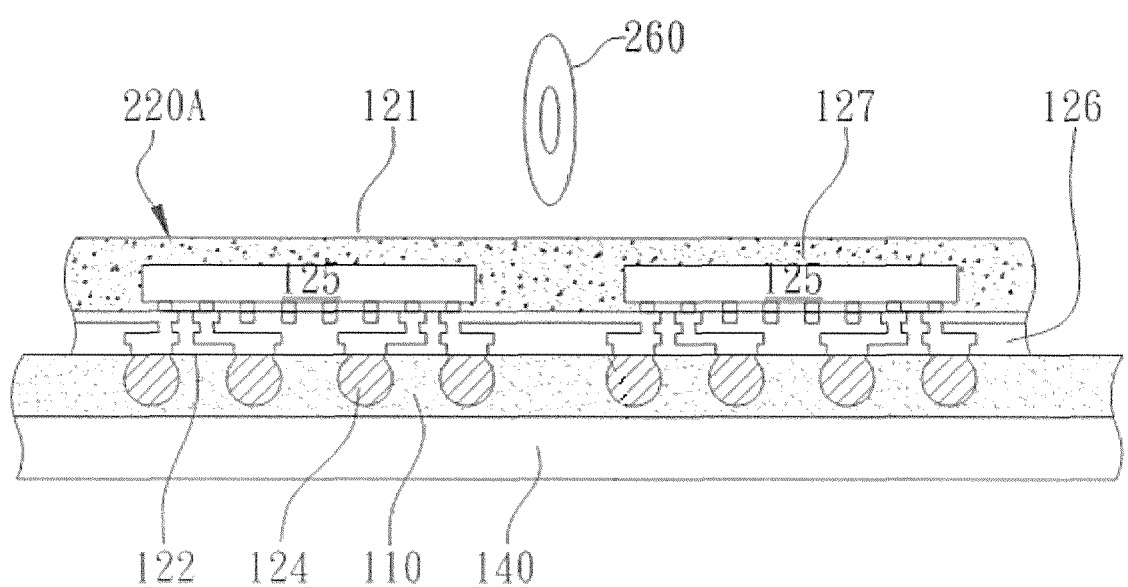
Figure 3C:
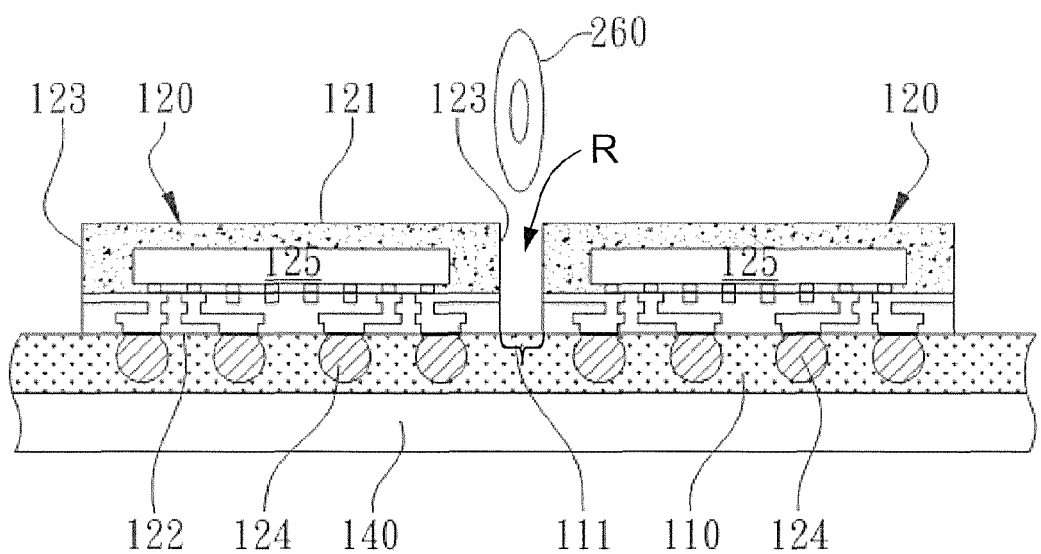

Referring to FIG. 3A, a film forming step is performed to provide a terminal-protection film 110. Referring to FIG. 3B and FIG. 3C, a mounting step of a package structure is performed to mount a plurality of chip package structures 120 onto the terminal-protection film 110. Each chip package structure 120 has a top side 121, a back side 122 opposite to the top side 121, and a plurality of lateral sides 123 (as shown in FIG. 3C). A plurality of terminals 124 is disposed on the back side 122. The terminal-protection film 110 at least partially seals the back side 122. In the embodiment, the terminal-protection film 110 encapsulates the terminals 124 and covers the back side 122 of the chip package structures 120. During the mounting step, the chip package structures 120 are parts of a chip package array 220A to be mounted, as shown in FIG. 3B. The mounting step further includes performing a singulation step on the chip package array 220A to form individual chip package structures 120. A method of the singulation step may include using a singulation device 260 such as a laser cutting device or a sawing device to singulate the chip package array 220A into a plurality of singulated packages. As such, lateral sides 123 of each chip package structure 120 are formed.

Figure 3D:
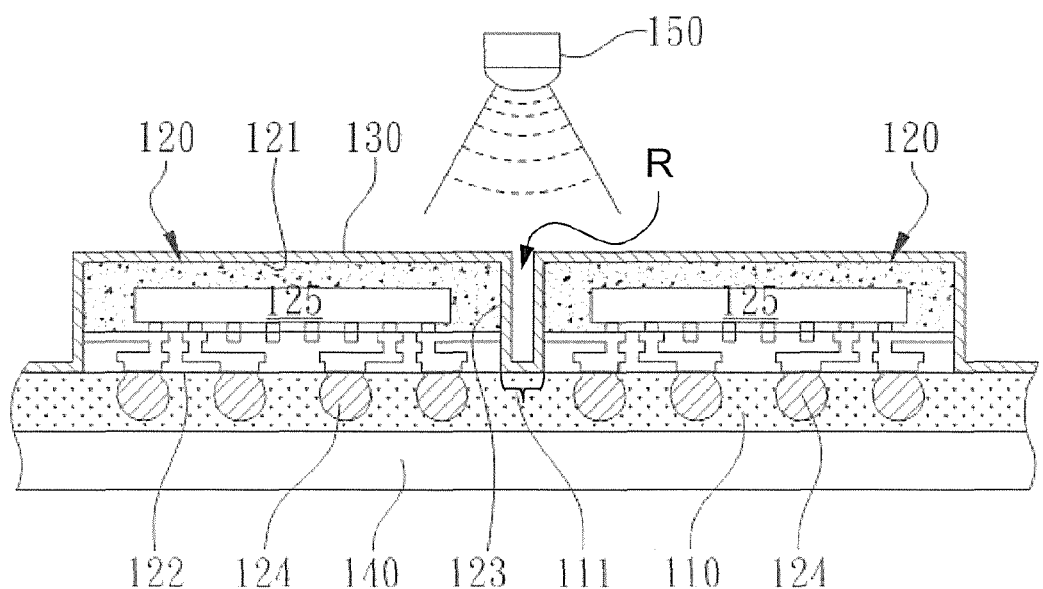

Referring to FIG. 3D, a high-temperature coating step is performed by a coating device 150 to form a coating layer 130. The coating layer 130 is disposed over the top side 121, the lateral sides 123, and an exposed surface 111 of the terminal-protection film 110. The exposed surface 111 of the terminal-protection film 110 surrounds a periphery region of the chip package structures 120. Due to the protection provided by the terminal-protection film 110, the coating layer 130 may not be formed on the back side 122 and the terminals 124. In the embodiment, the exposed surface 111 is a portion of a top surface of the terminal-protection film 110 facing to the chip package structures 120, wherein the exposed surface 111 is the part of the terminal-protection film 110 exposed between the chip package structures 120 as shown in FIG. 3D.

Figure 3E:
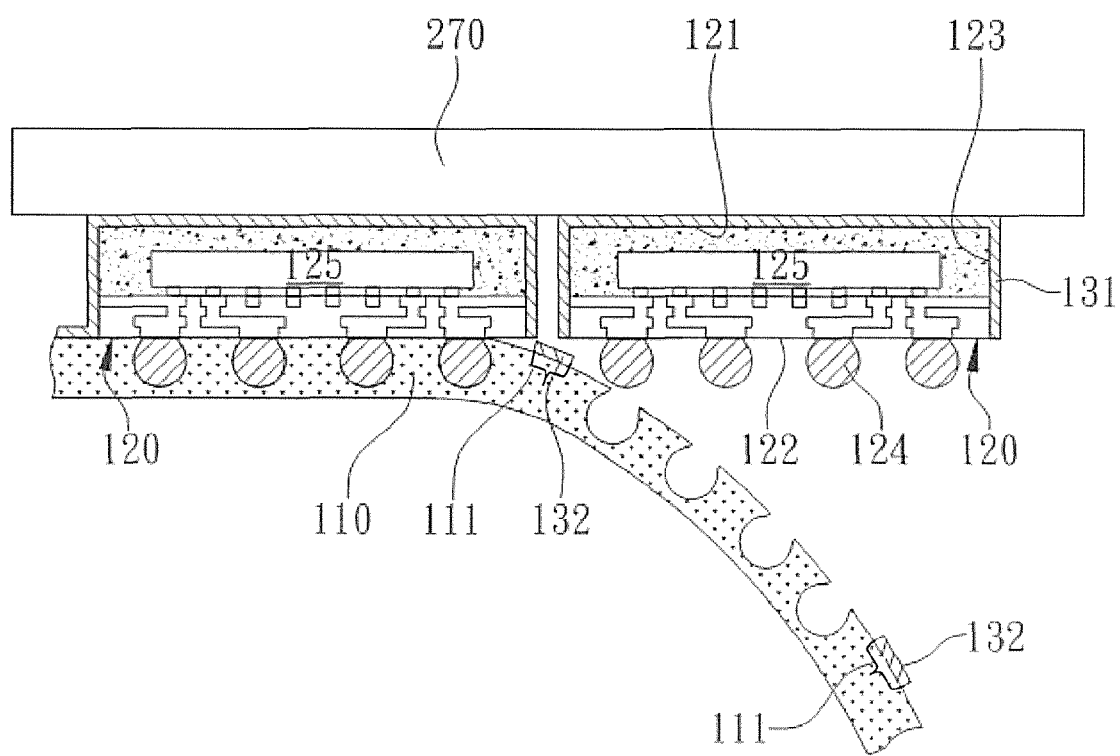

Referring to FIG. 3E, a film debonding step is performed to debond the terminal-protection film 110 from the chip package structures 120. The coating layer 130 is divided into a first portion 131 and a second portion 132. The first portion 131 of the coating layer 130 covers the top side 121 and the lateral sides 123 of the chip package structures 120. The second portion 132 of the coating layer 130 is formed on the exposed surface 111. The terminals 124 remain completely intact on the back side 122 of the chip package structures 120. During the film debonding step, a holding device 270 is adopted to secure the chip package structures 120 before debonding the terminal-protection film 110. In the embodiment, the holding device 270 may be an adhesive tape, an adhesive carrier or a suction pad.

Figure 4A:
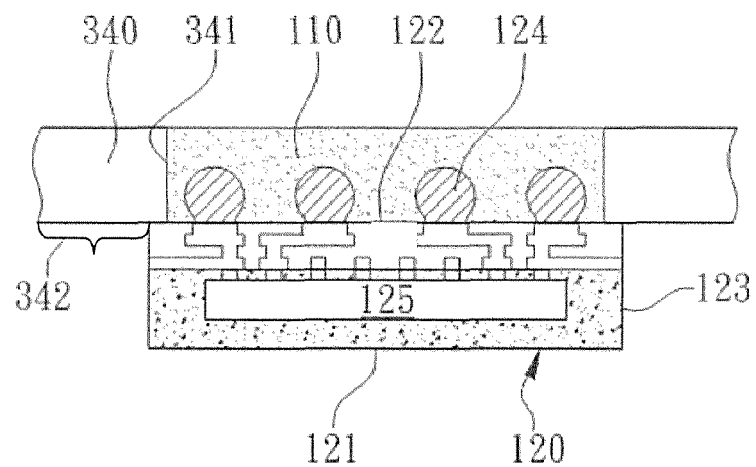
FIG. 4A to FIG. 4C are schematic cross-sectional views illustrating a manufacturing method of a chip package structure having a coating layer according to a third embodiment of the invention.
Figure 4B:
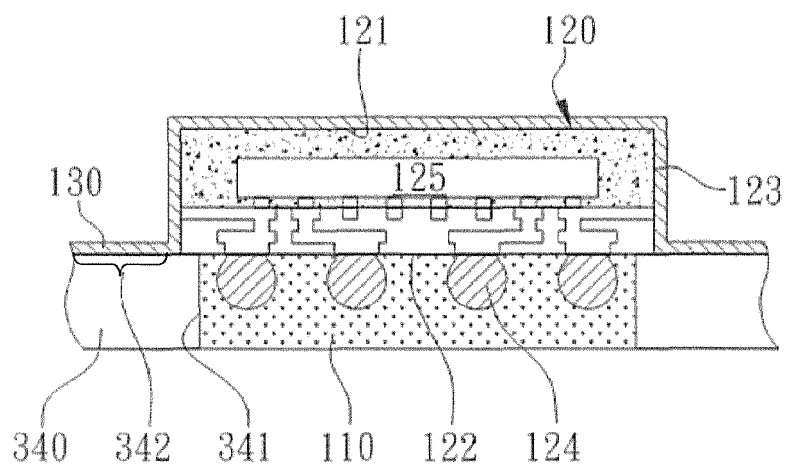
Figure 4C:
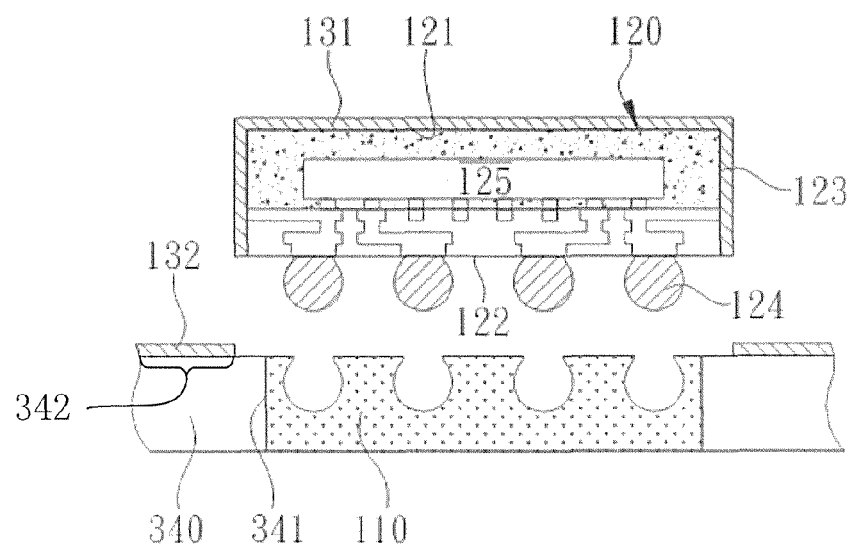

FIG. 4A to FIG. 4C are schematic cross-sectional views illustrating a manufacturing method of a chip package structure having a coating layer according to a third embodiment of the invention. The manufacturing method includes the following steps.

Refer to FIG. 4A, a film forming step is performed to provide a terminal-protection film 110. Subsequently, a mounting step of package structure is performed to mount at least one chip package structure 120 onto the terminal-protection film 110. The chip package structure 120 has a top side 121, a back side 122 opposite to the top side 121, and a plurality of lateral sides 123. A plurality of terminals 124 is disposed on the back side 122 of the chip package structure 120. The terminal-protection film 110 at least partially seals the back side 122. The terminal-protection film 110 encapsulates the terminals 124, such that the terminals 124 are buried into the terminal-protection film 110. In the step of providing the terminal-protection film 110, the terminal-protection film 110 in liquid phase is coated over a through hole 341 of a carrier 340. In the embodiment, a size of the through hole 341 is smaller than a size of the back side 122 of the chip package structure 120. Note that the step of providing the terminal-protection film 110 and the mounting step of package structure can be simultaneously performed. After the mounting step of the chip package structure 120, but before the step of forming a coating layer, the terminal-protection film 110 is cured to form a film.

Referring to FIG. 4B, a high-temperature coating step is performed to form a coating layer 130. The coating layer 130 is disposed over the top side 121, the lateral sides 123, and an exposed surface 342 of the carrier 340. The exposed surface 342 of the terminal-protection film 110 surrounds a periphery region of the chip package structure 120. Due to the protection provided by the terminal-protection film 110, the coating layer 130 may not be formed on the back side 122 and the terminals 124. In the embodiment, the exposed surface 342 is a portion of a top surface of the carrier 340 facing to the chip package structure 120, wherein the exposed surface 342 is the portion of the carrier 340 not covered by the back side 122 of the chip package structure 120 as shown in FIG. 4A.

Referring to FIG. 4C, a film debonding step is performed to debond the terminal-protection film 110 from the chip package structure 120. The coating layer 130 is divided into a first portion 131 and a second portion 132. The first portion 131 of the coating layer 130 covers the top side 121 and the lateral sides 123 of the chip package structure 120. The second portion 132 of the coating layer 130 is formed on the exposed surface 342. The terminals 124 remain completely intact on the back side 122 of the chip package structure 120.

Figure 5A:
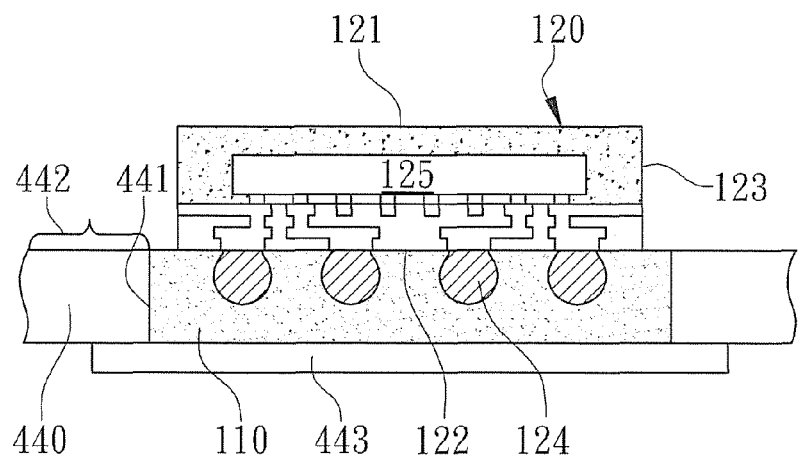
FIG. 5A to FIG. 5C are schematic cross-sectional views illustrating a manufacturing method of a chip package structure having a coating layer according to a fourth embodiment of the invention.
Figure 5B:
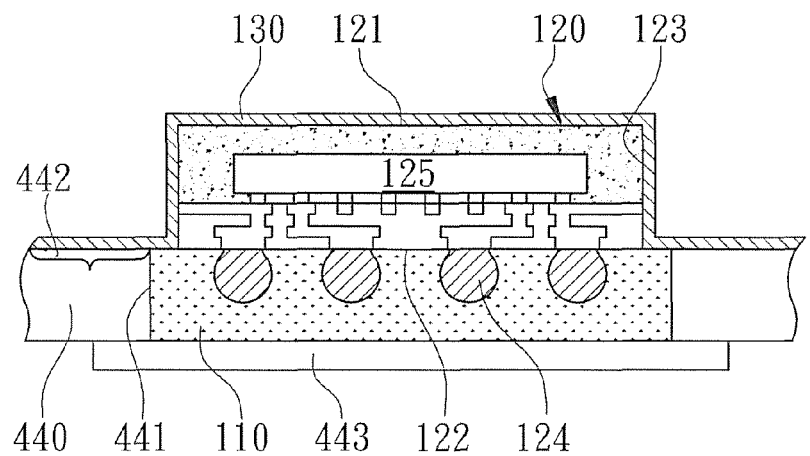
Figure 5C:
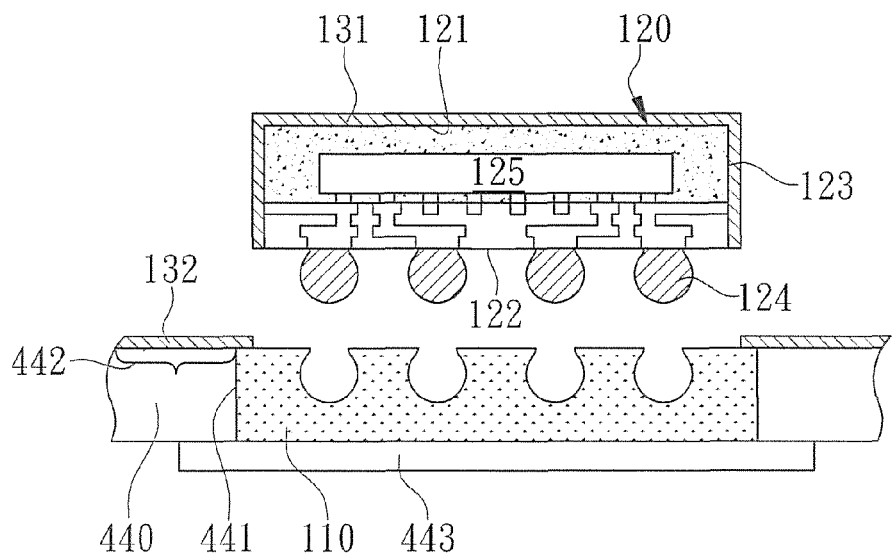

FIG. 5A to FIG. 5C are schematic cross-sectional views illustrating a manufacturing method of a chip package structure having a coating layer according to a fourth embodiment of the invention. The manufacturing method includes the following steps.

Referring to FIG. 5A, a film forming step is performed to provide a terminal-protection film 110. A mounting step of a package structure is subsequently performed to mount at least one chip package structure 120 onto the terminal-protection film 110. The chip package structure 120 has a top side 121, a back side 122 opposite to the top side 121, and a plurality of lateral sides 123. A plurality of terminals 124 is disposed on the back side 122. The terminal-protection film 110 at least partially seals the back side 122. In the step of providing the terminal-protection film 110, the terminal-protection film 110 in liquid phase is coated over a through hole 441 of a carrier 440. In the embodiment, a size of the through hole 441 is larger than a size of the back side 122 of the chip package structure 120. Furthermore, a carrier tape 443 may be pre-adhered to a bottom surface of the carrier 440 to form a non-penetrating hole for accommodating the terminal-protection film 110. The carrier tape 443 and the back side 122 of the chip package structure 120 are adhered to opposite sides of the terminal-protection film 110. After the mounting step of the chip package structure 120, but before the step of forming a coating layer, the terminal-protection film 110 is cured to form a film.

Referring to FIG. 5B, a high-temperature coating step is performed to form a coating layer 130. The coating layer 130 is disposed over the top side 121, the lateral sides 123, a part of the terminal-protection film 110 and an exposed surface 442 of the carrier 440. The exposed surface 442 of the carrier 440 surrounds a periphery region of the chip package structure 120. Due to the protection provided by the terminal-protection film 110, the coating layer 130 may not be formed on the back side 122 and the terminals 124. In the embodiment, the exposed surface 442 is a portion of a top surface of the carrier 440. The top surface of the carrier 440 being the surface facing the chip package structure 120 is not covered by the chip package structure 120.

Referring to FIG. 5C, a film debonding is performed to debond the terminal-protection film 110 from the chip package structure 120. The coating layer 130 is divided into a first portion 131 and a second portion 132. The first portion 131 of the coating layer 130 covers the top side 121 and the lateral sides 123 of the chip package structure 120. The second portion 132 of the coating layer 130 is formed on the exposed surface 442. The terminals 124 are formed on the back side 122 of the chip package structure 120.

Figure 6A:
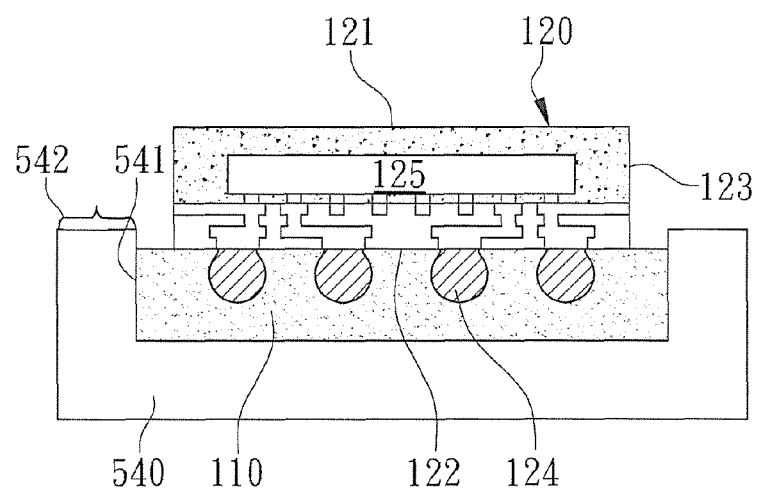
FIG. 6A to FIG. 6C are schematic cross-sectional views illustrating a manufacturing method of a chip package structure having a coating layer according to a fifth embodiment of the invention.
Figure 6B:
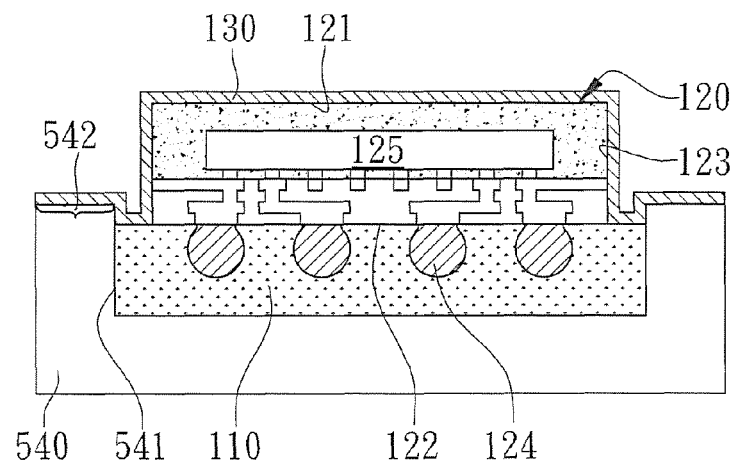
Figure 6C:
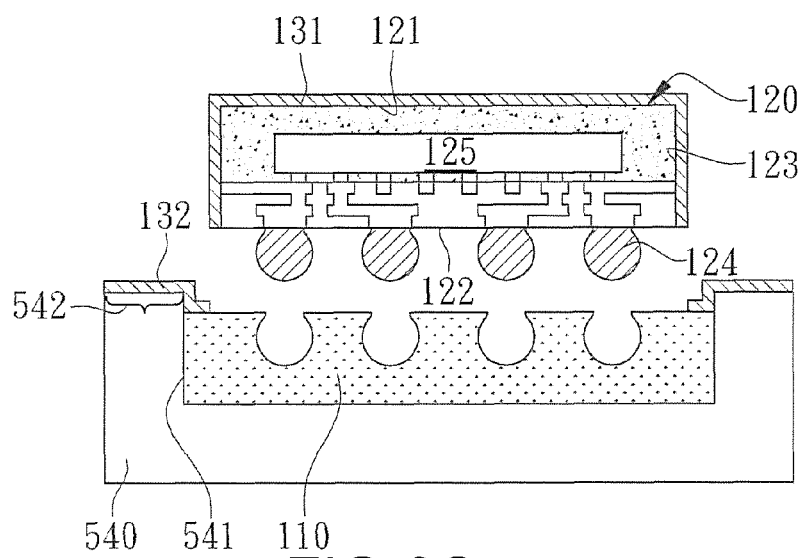

FIG. 6A to FIG. 6C are schematic cross-sectional views illustrating a manufacturing method of a chip package structure having a layer according to a fifth embodiment of the invention. The manufacturing method includes the following steps.

Referring to FIG. 6A, a film forming step is performed to provide a terminal-protection film 110. A mounting step of a package structure is subsequently performed to mount at least one chip package structure 120 onto the terminal-protection film 110. The chip package structure 120 has a top side 121, a back side 122 opposite to the top side 121, and a plurality of lateral sides 123. A plurality of terminals 124 is disposed on the back side 122. The terminal-protection film 110 at least partially seals the back side 122 of the chip package structure 120. In the step of providing the terminal-protection film 110, the terminal-protection film 110 in liquid phase is coated over a cavity 541 of a carrier 540. After the mounting step of the chip package structure 120, but before the step of forming a coating layer, the terminal-protection film 110 is cured to form a film. As shown in FIG. 6A, a size of the cavity 541 is larger than a size of the back side 122 of the chip package structure 120.

Referring to FIG. 6B, a high-temperature coating step is performed to form a coating layer 130 over the top side 121, the lateral sides 123, a part of the terminal-protection film 110 and an exposed surface 542 of the carrier 540. The exposed surface 542 of the carrier 540 surrounds a periphery region of the chip package structure 120 of the chip package structure 120. Due to the protection provided by the terminal-protection film 110, the coating layer 130 may not be formed on the back side 122 and the terminals 124. In the embodiment, the exposed surface 542 is a portion of a top surface of the carrier 540 facing the chip package structure 120. The exposed surface 542 is exposed by the back side 122 of the chip package structure 120 as shown in FIG. 6A and FIG. 6B.

Referring to FIG. 6C, a film debonding is performed to debond the terminal-protection film 110 from the chip package structure 120. The coating layer 130 is divided into a first portion 131 and a second portion 132. The first portion 131 of the coating layer 130 covers the top side 121 and the lateral sides 123 of the chip package structure 120. The second portion 132 of the coating layer 130 is formed on the exposed surface 542. The terminals 124 remain completely intact on the back side 122 of the chip package structure 120.

Figure 7A:
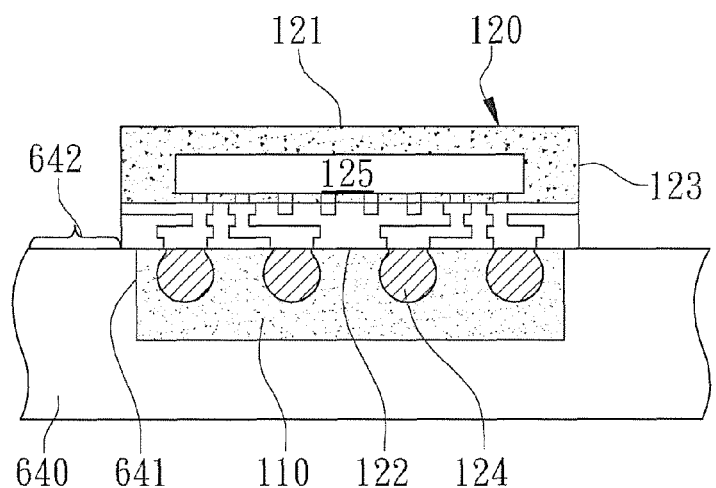
FIG. 7A to FIG. 7C are schematic cross-sectional views illustrating a manufacturing method of a chip package structure having a coating layer according to a sixth embodiment of the invention.
Figure 7B:
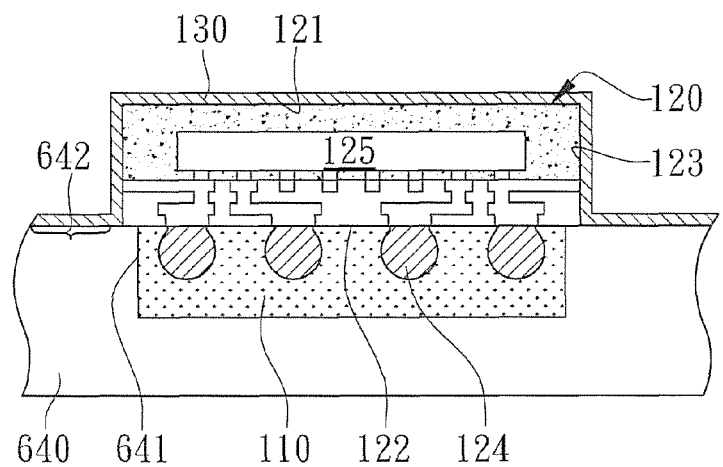
Figure 7C:
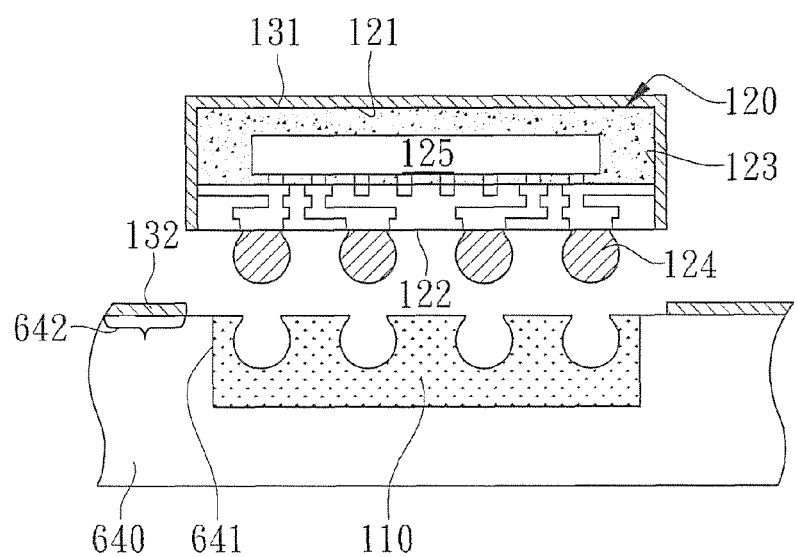

FIG. 7A to FIG. 7C are schematic cross-sectional views illustrating a manufacturing method of a chip package structure having a coating layer according to a sixth embodiment of the invention. The manufacturing method includes the following steps.

Referring to FIG. 7A, a film forming step is performed to provide a terminal-protection film 110. A mounting step of a package structure is then performed to mount at least one chip package structure 120 onto the terminal-protection film 110. The chip package structure 120 has a top side 121, a back side 122 opposite to the top side 121, and a plurality of lateral sides 123. A plurality of terminals 124 is disposed on the back side 122. The terminal-protection film 110 at least partially seals the back side 122 of the chip package structure 120. In the step of providing the terminal-protection film 110, the terminal-protection film 110 in liquid phase is coated over a cavity 641 of a carrier 640. After the mounting step of the chip package structure 120, but before the step of forming a coating layer, the terminal-protection film 110 is cured to form a film. In the embodiment, a size of the cavity 641 is smaller than a size of the back side 122 of the chip package structure 120.

Referring to FIG. 7B, a high-temperature coating step is performed to form a coating layer 130 over the top side 121, the lateral sides 123, and an exposed surface 642 of the carrier 640. The exposed surface 642 of the carrier 640 surrounds a periphery region of the chip package structure 120. Due to the protection provided by the terminal-protection film 110, the coating layer 130 may be not formed on the back side 122 and the terminals 124.

Referring to FIG. 7C, a film debonding step is performed to debond the terminal-protection film 110 from the chip package structure 120. The coating layer 130 is divided into a first portion 131 and a second portion 132. The first portion 131 of the coating layer 130 covers the top side 121 and the lateral sides 123 of the chip package structure 120. The second portion 132 of the coating layer 130 is formed on the exposed surface 642. The terminals 124 remain completely intact on the back side 122 of the chip package structure 120.

FIG. 8A to FIG. 8D are schematic cross-sectional views illustrating a manufacturing method of a chip package structure having a coating layer according to a seventh embodiment of the invention. The manufacturing method includes the following steps.

Figure 8A:
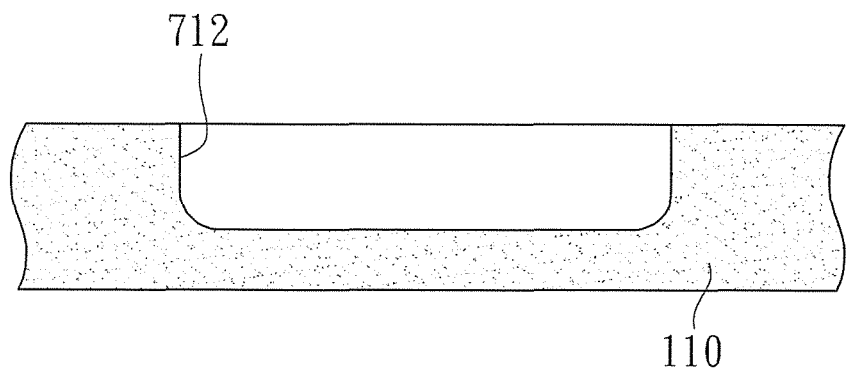
FIG. 8A to FIG. 8D are schematic cross-sectional views illustrating a manufacturing method of a chip package structure having a coating layer according to a seventh embodiment of the invention.

Referring to FIG. 8A, a film forming step is performed to provide a terminal-protection film 110. In the step of providing the terminal-protection film 110, the terminal-protection film 110 is cured to form a film and has at least one terminal receiving hole 712. The terminal-protection film 110 has properties of thermal conductivity, heat resistance, and viscidity.

Figure 8B:
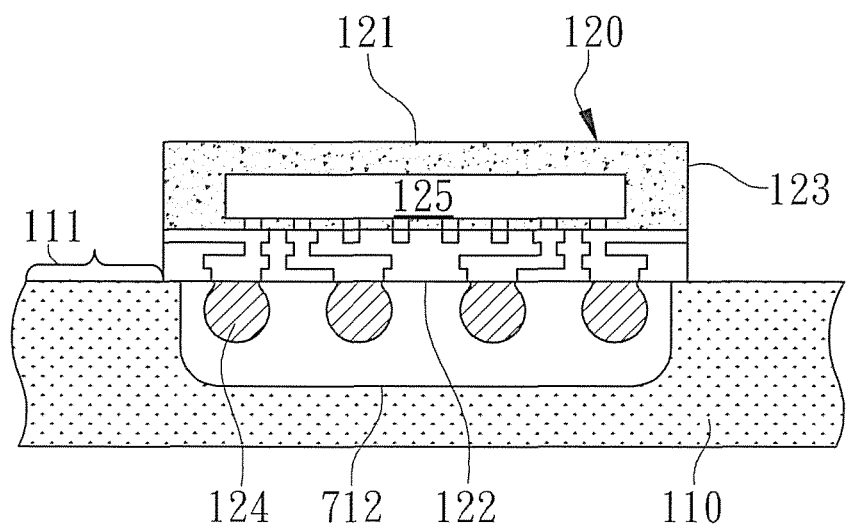

Referring to FIG. 8B, a mounting step of a package structure is performed to mount at least one chip package structure 120 onto the terminal-protection film 110. The chip package structure 120 has a top side 121, a back side 122 opposite to the top side 121, and a plurality of lateral sides 123. A plurality of terminals 124 is disposed on the back side 122. The terminal-protection film 110 at least partially seals the back side 122. In the mounting step of the chip package structure, the terminals 124 are sealed inside the terminal receiving hole 712.

Figure 8C:
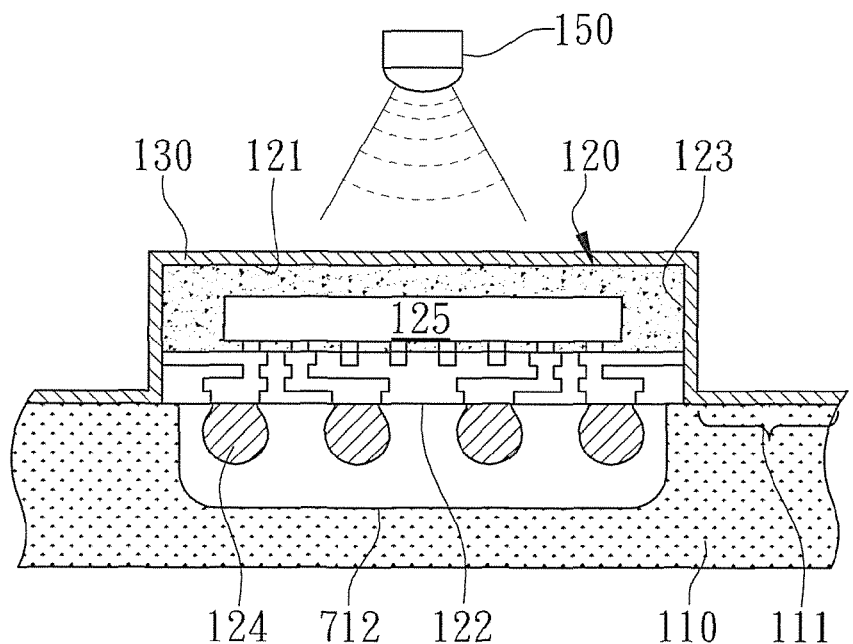

Referring to FIG. 8C, a high-temperature coating step is performed to form a coating layer 130 over the top side 121, the lateral sides 123, and an exposed surface 111 of the terminal-protection film 110. The exposed surface 111 of the terminal-protection film 110 surrounds a periphery region of the chip package structure 120. Due to the protection provided by the terminal-protection film 110, the coating layer 130 may not be formed on the back side 122 and the terminals 124. As shown in FIG. 8B, the exposed surface 111 is a portion of a top surface of the terminal-protection film 110 facing to the chip package structure 120, wherein the exposed surface 111 is not covered by the back side 122 of the chip package structure 120.

The terminal-protection film 110 has thermal conductivity. In the step of forming the coating layer 130, a heat dissipation is simultaneously performed by the terminal-protection film 110. As such, a temperature of the terminal-protection film 110 may be lower than a forming temperature of the coating layer 130 and a melting point of the terminals 124. Therefore, the heat energy generated from the chip package structure 120 is transmitted to the external through the terminal-protection film 110.

Figure 8D:
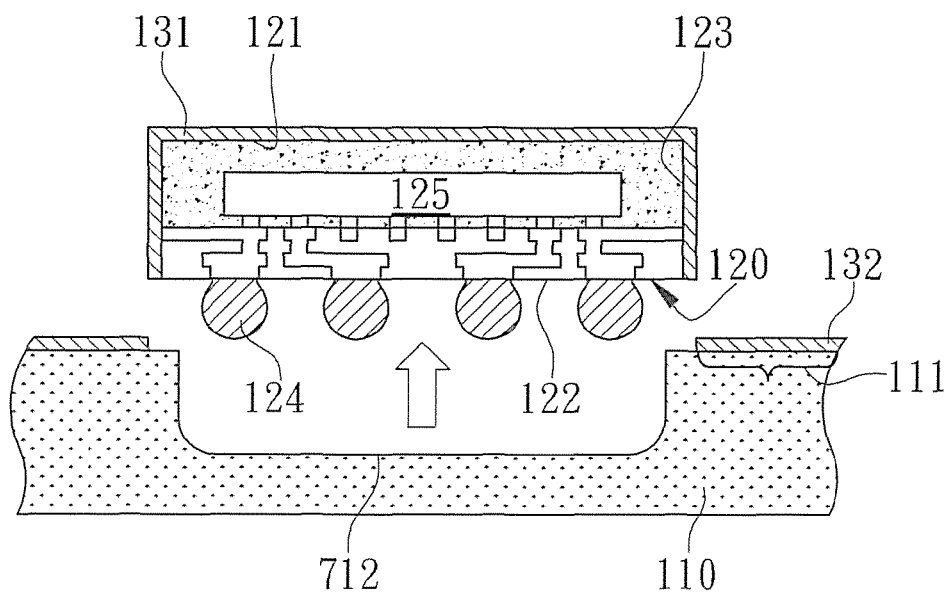

Referring to FIG. 8D, a film debonding step is performed to debond the terminal-protection film 110 from the chip package structure 120. The coating layer 130 is divided into a first portion 131 and a second portion 132. The first portion 131 of the coating layer 130 covers the top side 121 and the lateral sides 123 of the chip package structure 120. The second portion 132 of the coating layer 130 is formed on the exposed surface 111. The terminals 124 remain completely intact on the back side 122 of the chip package structure 120.

Based on the above, the terminal-protection film 110 has properties of viscosity, plasticity, heat resistance, and thermal conductivity for protecting the back side 122 (e.g., a base surface of products) of the chip package structure 120 and the terminals 124 (e.g., tin solder balls) from effects of the high temperature process. The terminal-protection film 110 further facilitates heat dissipation of the chip package structure 120. The manufacturing method disclosed herein can be widely used in backend processing operations of different package process. The chip package structure 120 may have a variety of carrying ways, and the usage of adhesives adapted for the terminal-protection film 110 is not limited to the aforementioned disclosure.

The aforementioned disclosure includes the exemplary examples of the invention, however, the scope of the invention is not limited thereto. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a chip package structure having a coating layer, comprising:
   providing a terminal-protection film;
   disposing at least one chip package structure onto the terminal-protection film, wherein the chip package structure has a top side, a back side opposite to the top side, and a plurality of lateral sides, and wherein a plurality of terminals is disposed on the back side, and the terminal-protection film at least partially seals the back side;
   forming a coating layer over the top side, the lateral sides, and a periphery region of the chip package structure, wherein the coating layer is not formed on the back side and the terminals;
   debonding the terminal-protection film to separate the chip package structure from the terminal-protection film and divide the coating layer into a first portion and a second portion, wherein the first portion of the coating layer covers the top side and the lateral sides of the chip package structure, and the second portion of the coating layer is a remaining portion of the coating layer, wherein the terminals remain completely intact on the back side of the chip package structure after the debonding of the terminal-protection film.

2. The method in claim 1, wherein a heat dissipation is performed by the terminal-protection film during forming the coating layer by cooling down of the coating layer upon contact with the terminal-protection film.

3. The method in claim 2, wherein the coating layer is an electromagnetic interference shielding layer formed through sputtering.

4. The method in claim 1, wherein in the step of providing the terminal-protection film, the terminal-protection film in liquid phase is coated on a carrier; and after the mounting step of the chip package structure, but before the step of forming the coating layer, the terminal-protection film is cured to form a film.

5. The method in claim 4, wherein in the step of forming the coating layer, a temperature of the terminal-protection film is lower than a forming temperature of the coating layer and a melting point of the terminals, and a heat energy generated from the chip package structure is transmitted to the carrier through the terminal-protection film.

6. The method in claim 1, wherein in the mounting step of the chip package structure, the terminal-protection film seals the terminals within the terminal-protection film and covers at least a portion of the back side of the chip package structure.

7. The method in claim 6, wherein in the mounting step of the chip package structure, the chip package structure includes a singulated package to be mounted.

8. The method in claim 6, wherein in the mounting step of the chip package structure, the chip package structure is a part of a chip package array mounted on the terminal-protection film, and the mounting step of the chip package structure further includes performing a singulation step on the chip package array to form a plurality of singulated chip package structures and the lateral sides thereof.

9. The method in claim 2, wherein in the step of providing the terminal-protection film, the terminal-protection film in liquid phase is coated over a through hole or a cavity of a carrier; and after the mounting step of the chip package structure, but before the step of forming the coating layer, the terminal-protection film is cured to form a film.

10. The method in claim 9, wherein in the step of forming the coating layer, a temperature of the terminal-protection film is lower than a forming temperature of the coating layer and a melting point of the terminals, and a heat energy generated from the chip package structure is transmitted to the carrier through the terminal-protection film.

11. The method in claim 1, wherein in the step of providing the terminal-protection film, the terminal-protection film is cured to form a film and has at least one terminal receiving hole; in the mounting step of the chip package structure, the terminals are sealed inside the at least one terminal receiving hole; and in the step of forming the coating layer, a heat dissipation is performed by the terminal-protection film, wherein a temperature of the terminal-protection film is lower than a forming temperature of the coating layer and a melting point of the terminals, and a heat energy generated from the chip package structure is transmitted to the external through the terminal-protection film.

12. A manufacturing method of a chip package structure having a high-temperature coating layer, comprising:
   providing a carrier;
   forming a terminal-protection film on the carrier
   mounting at least one chip package structure onto a terminal-protection film, wherein the chip package structure has a top side, a back side opposite to the top side, and a plurality of lateral sides, and wherein a plurality of terminals is disposed on the back side, and the terminal-protection film at least partially seals the back side;
   forming a coating layer over the top side, the lateral sides, and an exposed surface of the terminal-protection film or a carrier exposed by the chip package structure; and
   debonding the terminal-protection film from the chip package structure.

13. The method in claim 12, wherein in the mounting step of the chip package structure, the terminal-protection film seals the terminals within the terminal-protection film and covers at least a portion of the back side of the chip package structure.

14. The method in claim 13, wherein the terminal-protection film completely covers an inner area of the back side of the chip package structure, and the carrier covers a peripheral region of the back side of the chip package structure.

15. The method in claim 13, wherein the terminals are embedded into the terminal-protection film.

16. The method in claim 12, wherein the terminal-protection film comprises at least one terminal receiving hole, and in the mounting step of the chip package structure, the terminals are sealed inside the at least one terminal receiving hole.

17. The method in claim 12, wherein in the step of forming the coating layer, the coating layer is not formed on the back side and the terminals.

18. The method in claim 12, wherein a hardness of the terminal-protection film during the mounting of the at least one chip package structure is less than a hardness of the terminal-protection film during debonding of the terminal-protection film from the chip package structure.

19. The method in claim 12, wherein during forming the coating layer, the terminal-protection film performs heat dissipation upon contact with the coating layer.

20. The method in claim 12, wherein during providing the terminal-protection film, the terminal-protection film in liquid phase is coated over the carrier and cured to form an elastic film.

* * * * *